US011505864B2

(12) United States Patent
Malinen et al.

(10) Patent No.: US 11,505,864 B2
(45) Date of Patent: Nov. 22, 2022

(54) ADJUSTABLE FLUID INLET ASSEMBLY FOR A SUBSTRATE PROCESSING APPARATUS AND METHOD

(71) Applicant: Picosun Oy, Espoo (FI)

(72) Inventors: Timo Malinen, Espoo (FI); Väinö Kilpi, Espoo (FI); Marko Pudas, Espoo (FI)

(73) Assignee: Picosun Oy, Espoo (FI)

( * ) Notice: Subject to any disclaimer, the term of this patent is extended or adjusted under 35 U.S.C. 154(b) by 222 days.

(21) Appl. No.: 16/622,070

(22) PCT Filed: Jun. 21, 2017

(86) PCT No.: PCT/FI2017/050465
§ 371 (c)(1),
(2) Date: Dec. 12, 2019

(87) PCT Pub. No.: WO2018/234611
PCT Pub. Date: Dec. 27, 2018

(65) Prior Publication Data
US 2021/0189560 A1    Jun. 24, 2021

(51) Int. Cl.
*C23C 16/455* (2006.01)
*B01J 3/02* (2006.01)
(Continued)

(52) U.S. Cl.
CPC ........... *C23C 16/45544* (2013.01); *B01J 3/02* (2013.01); *B01J 3/03* (2013.01); *C23C 16/45561* (2013.01);
(Continued)

(58) Field of Classification Search
None
See application file for complete search history.

(56) References Cited

U.S. PATENT DOCUMENTS 5,232,508 A * 8/1993 Arena ............... C23C 16/45565
118/728
5,238,532 A * 8/1993 Zarowin ........... H01J 37/32082
156/345.43
(Continued)

FOREIGN PATENT DOCUMENTS

EP    0095887 A1    12/1987
EP    0548944 A1    6/1993
(Continued)

OTHER PUBLICATIONS

Japan Patent Office, Notification of ground of rejection, Application No. 2019-568630, dated May 10, 2021, 4 pages.
(Continued)

*Primary Examiner* — Binu Thomas
(74) *Attorney, Agent, or Firm* — Ziegler IP Law Group, LLC

(57) ABSTRACT

A substrate processing apparatus, includes a sealed pressure vessel, such as an Atomic Layer Deposition, ALD, apparatus, a fluid inlet assembly attached to a wall of the sealed pressure vessel, the fluid inlet assembly having a fluid inlet pipe passing through the wall, and a resilient element in the fluid inlet assembly around the fluid inlet pipe coupling the inlet pipe to the wall, where one of an interior surface and an exterior surface of the resilient element sees pressure prevailing within the pressure vessel and the other sees ambient pressure, and where the fluid inlet pipe prevents fluid carried inside from being in contact with the resilient element, and a relating method.

15 Claims, 5 Drawing Sheets

(51) Int. Cl.
  *B01J 3/03*   (2006.01)
  *H01L 21/67*  (2006.01)
  *C30B 25/14*  (2006.01)

(52) U.S. Cl.
  CPC ........ *C23C 16/45563* (2013.01); *C30B 25/14* (2013.01); *H01L 21/67017* (2013.01); *H01L 21/67126* (2013.01)

(56) References Cited

U.S. PATENT DOCUMENTS

| | | | |
|---|---|---|---|
| 5,843,234 A * | 12/1998 | Finn | C23C 16/45563 118/730 |
| 6,347,749 B1 * | 2/2002 | Moore | C23C 16/45563 118/715 |
| 7,018,478 B2 | 3/2006 | Lindfors et al. | |
| 7,827,932 B2 | 11/2010 | Kojima et al. | |
| 8,741,062 B2 | 6/2014 | Lindfors et al. | |
| 2007/0074661 A1 | 4/2007 | Franken et al. | |
| 2009/0017190 A1 | 1/2009 | Sferlazzo et al. | |
| 2009/0263578 A1 | 10/2009 | Lindfors et al. | |
| 2010/0043975 A1 * | 2/2010 | Hayashi | H01J 37/3244 156/345.33 |
| 2010/0212592 A1 | 8/2010 | Li | |
| 2013/0337171 A1 | 12/2013 | Sasagawa | |
| 2014/0311408 A1 | 10/2014 | De et al. | |
| 2016/0319422 A1 | 11/2016 | Kurita et al. | |

FOREIGN PATENT DOCUMENTS

| | | |
|---|---|---|
| EP | 0806496 A1 | 11/1997 |
| JP | S58167387 A | 10/1983 |
| JP | S59001671 | 1/1984 |
| JP | S6134932 A | 2/1986 |
| JP | S63164308 A | 7/1988 |
| JP | 03194918 A * | 8/1991 |
| JP | H03194918 A | 8/1991 |
| JP | H04037268 U | 3/1992 |
| JP | H04130085 A | 5/1992 |
| JP | H04149097 A | 5/1992 |
| JP | H04246176 * | 9/1992 |
| JP | H04246176 A | 9/1992 |
| JP | H04133430 U | 12/1992 |
| JP | H05090161 | 4/1993 |
| JP | H05214536 A | 8/1993 |
| JP | H0647270 * | 2/1994 |
| JP | H0647270 A | 2/1994 |
| JP | H0878392 A | 3/1996 |
| JP | H08109998 A | 4/1996 |
| JP | 2001234346 A | 8/2001 |
| JP | 2001262322 A | 9/2001 |
| JP | 2007073627 A | 3/2007 |
| JP | 2008153409 A | 7/2008 |
| TW | 576873 B | 2/2004 |
| TW | 201402856 A | 1/2014 |

OTHER PUBLICATIONS

International Search Report, Application No. PCT/FI2017/050465, dated Mar. 2, 2018, 6 pages.
Written Opinion of the International Searching Authority, Application No. PCT/FI2017/050465, dated Mar. 2, 2018, 6 pages.
The Patent Office of The People's Republic of China, Notification of the Fist Office Action, Application No. 2017800921200, dated Aug. 25, 2021, 5 pages.
The Patent Office of the People's Republic of China, Search Report, Application No. 2017800921200, dated Aug. 19, 2021, 2 pages.
Japan Patent Office, Notice of Reasons for Refusal, Application No. 2019-568630, dated Jan. 19, 2022.
European Patent Office, Supplementary European Search Report, Application No. 17914655.0, dated Jun. 5, 2020, 8 Pages.

* cited by examiner

ADJUSTABLE FLUID INLET ASSEMBLY FOR A SUBSTRATE PROCESSING APPARATUS AND METHOD

This is a U.S. National Stage under 35 U.S.C. 371 of international application PCT/FI2017/050465 filed 21 Jun. 2017.

FIELD

The aspects of the disclosed embodiments generally relate to substrate processing reactors and their methods of operation. More particularly, but not exclusively, the aspects of the disclosed embodiments relate to atomic layer deposition (ALD) reactors.

BACKGROUND

This section illustrates useful background information without admission of any technique described herein representative of the state of the art.

Various substrate processing apparatuses, such as deposition reactors, typically have parts at different pressure regions reaching from ambient pressure to vacuum pressure. Vacuum parts are typically fitted to size in ambient pressure, and differences in temperature and pressure will cause deformations in non-desirable places. Especially chemical inlet pipes to chambers which are in reduced pressure are typically guided from or via ambient pressure regions, and in most cases via regions having a set of different temperatures. This will cause significant stress to the chemical inlet pipes, which can be a critical place of failure. An example of a chemical inlet into a chamber is shown in U.S Pat. No. 8,741,062 B1.

SUMMARY

The aspects of the disclosed embodiments are directed to providing an improved apparatus with a fluid inlet assembly, or at least to provide an alternative to existing technology.

According to a first example aspect of the disclosed embodiments there is provided a substrate processing apparatus, comprising:
a sealed pressure vessel;
a fluid inlet assembly attached to a wall of the sealed pressure vessel, the fluid inlet assembly having a fluid inlet pipe passing through the wall, the apparatus further comprising:
a resilient element in the fluid inlet assembly around the fluid inlet pipe coupling the inlet pipe to the wall, where one of an interior surface and an exterior surface of the resilient element sees pressure prevailing within the pressure vessel and the other sees ambient pressure, and where the fluid inlet pipe prevents fluid carried inside from being in contact with the resilient element.

The disclosed apparatus, in certain example embodiments, provides for a pressure adjusted inlet clamping. In certain example embodiments, the resilient element is configured to press against the pressure vessel due to a pressure difference between ambient pressure and the pressure prevailing within the interior of the pressure vessel.

The pressure vessel being sealed means in certain example embodiments that the reaction vessel is a closed or a closable chamber.

In certain example embodiments, the resilient element is configured to deform under displacements between fixed parts of the apparatus or assembly. In certain example embodiments, the resilient element is gas tight or mostly gas tight. When the resilient element is only mostly gas tight a gas leakage through the element is preferably only a small leakage to maintain separate pressure regions.

In certain example embodiments, the sealed pressure vessel forms an outer chamber that surrounds an inner chamber which is a sealed reaction chamber.

In certain example embodiments, the fluid inlet assembly is attached to a reaction chamber wall. In certain example embodiments, the fluid inlet assembly is attached to an outer chamber surrounding a reaction chamber. Accordingly, depending on the implementation, the above-identified sealed pressure vessel may refer to the outer chamber or to the reaction chamber (the reaction chamber either having or not having an outer chamber to surround it).

In certain example embodiments, the inlet pipe is arranged to be is assembled by removing at least a portion of the inlet pipe inwards via an interior (or reaction chamber) of the apparatus.

In certain example embodiments, the inlet pipe is arranged to be disassembled by removing at least a portion of the inlet pipe outwards to a direction pointing away from the apparatus (or reaction chamber).

In certain example embodiments, the inlet pipe is arranged to be in a fixed position with respect to a reaction chamber wall. In such embodiments, the inlet pipe may be configured to deform or bend at other points or joints.

In certain example embodiments, the inlet pipe is arranged to be in a rotatable position with respect to a reaction chamber wall. In such embodiments, the inlet pipe may be configured to deform or bend at other points or joints.

In certain example embodiments, the resilient element is configured to cause mechanical pressure to the inlet pipe.

In certain example embodiments, the direction of mechanical pressure is inwards, towards the reaction chamber.

In certain example embodiments, the inlet pipe is formed of two pipes arranged to slide inside each other.

In certain example embodiments, the reaction chamber comprises a collar locking the inlet pipe in its position.

In certain example embodiments, the inlet pipe is equipped with a heat distributing element to distribute heat along the inlet pipe. In certain example embodiments, the heat distributing element extends over the whole longitudinal distance of the inlet pipe. In certain example embodiments, the heat distributing element extends over only a part of the whole longitudinal distance of the inlet pipe. In certain example embodiments, the heat distributing element is formed of a single part. In certain example embodiments, the heat distributing element is formed of a plurality of parts. In certain example embodiments, the heat distributing element is or comprises an active heater element. In certain example embodiments, the heat distributing element is positioned in ambient pressure conditions. In certain example embodiments, the heat distributing element is positioned at a vacuum side (of the pressure vessel).

In certain example embodiments, the heat distributing element extends over a feed-through point of the wall of the sealed pressure vessel.

In certain example embodiments, a contact point at which the inlet pipe meets the reaction chamber is a non-permanent fixing point.

In certain example embodiments, the contact point is sealed and/or enforced.

According to a second example aspect of the disclosed embodiments there is provided a method, comprising:

providing a sealed pressure vessel with a fluid inlet assembly attached to a wall of the sealed pressure vessel, the fluid inlet assembly having a fluid inlet pipe passing through the wall, and a resilient element in the fluid inlet assembly around the fluid inlet pipe coupling the inlet pipe to the wall, where one of an interior surface and an exterior surface of the resilient element sees pressure prevailing within the pressure vessel and the other sees ambient pressure, and where the fluid inlet pipe prevents fluid carried inside from being in contact with the resilient element, the method further comprising:

causing mechanical pressure to the inlet pipe via contraction of the resilient element, the direction of the mechanical pressure being towards the pressure vessel interior.

In certain example embodiments, the mechanical pressure is caused by a pressure difference between the pressure prevailing within the pressure vessel and the ambient pressure.

Different non-binding example aspects and embodiments of the present disclosure have been illustrated in the foregoing. The above embodiments are used merely to explain selected aspects or steps that may be utilized in implementations of the present disclosure. Some embodiments may be presented only with reference to certain example aspects of the present disclosure. It should be appreciated that corresponding embodiments apply to other example aspects as well. Any appropriate combinations of the embodiments may be formed.

BRIEF DESCRIPTION OF THE DRAWINGS

The aspects of the disclosed embodiments will now be described, by way of example only, with reference to the accompanying drawings, in which.

DETAILED DESCRIPTION

In the following description, Atomic Layer Deposition (ALD) technology is used as an example. However, the aspects of the disclosed embodiments are not limited to ALD technology, but it can be exploited in a wide variety of substrate processing apparatuses applying different temperature and/or pressure ranges, for example, in Chemical Vapor Deposition (CVD) reactors. The substrate processing apparatuses may be vacuum deposition apparatuses. Alternatively, the present disclosure can be applied to apparatuses performing processes other than deposition, such as sintering or etching, for example, Atomic Layer Etching (ALE).

The basics of an ALD growth mechanism are known to a skilled person. ALD is a special chemical deposition method based on the sequential introduction of at least two reactive precursor species to at least one substrate. It is to be understood, however, that one of these reactive precursors can be substituted by energy when using, for example, photon-enhanced ALD or plasma-assisted ALD, for example PEALD, leading to single precursor ALD processes. For example, deposition of a pure element, such as metal, requires only one precursor. Binary compounds, such as oxides can be created with one precursor chemical when the precursor chemical contains both of the elements of the binary material to be deposited. Thin films grown by ALD are dense, pinhole free and have uniform thickness.

Figure 1:
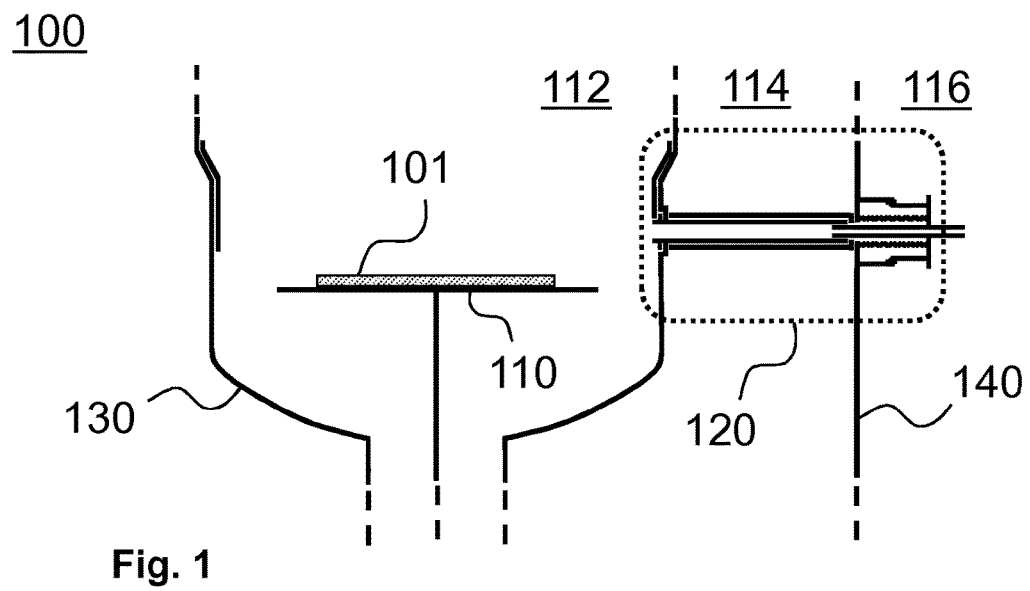
FIG. 1 shows parts of a substrate processing apparatus in accordance with certain example embodiments of the present disclosure.

FIG. 1 shows parts of a substrate processing apparatus 100 in accordance with certain example embodiments. A reaction space 112 is a defined volume within a reaction chamber. The desired substrate processing, i.e., desired chemical reactions occur at a surface of a substrate 101 in the reaction space 112. During processing, the substrate 101 in certain example embodiments is supported by a substrate holder 110 within the reaction chamber.

The reaction chamber is a pressure vessel defined by a reaction chamber wall (or walls) 130. In certain example embodiments, as shown in FIG. 1, the apparatus 100 comprises a further pressure vessel, an outer chamber. The outer chamber surrounds the reaction chamber thereby closing an intermediate space 114 in between the reaction chamber wall 130 and an outer chamber (outer) wall 140.

During processing, the reaction space 112 within the reaction chamber is in vacuum. In case the apparatus 100 is a deposition reactor, for example an ALD or CVD reactor, the pressure within the reaction chamber/reaction space 112 may be for example 1 µbar to 0.1 bar, or more preferably 0.1 to 1 mbar. In certain example embodiments, the intermediate space 114 has pressure higher than the pressure in the reaction chamber, such as around 10 mbar. The intermediate space 114 can contain heaters. The pressure arrangement prevents reactive chemicals from coming into contact with the heaters, for example.

Ambient conditions (temperature, pressure) generally prevail on the outside of the outer chamber wall 140. The space on the outside of the outer chamber wall 140 in which ambient temperature and pressure prevail is denoted by reference numeral 116.

A fluid inlet assembly 120 is attached to the outer chamber wall 140 to provide the reaction space 112 with a desired chemical (although in other embodiments, for example in embodiments missing the outer chamber, a corresponding fluid inlet assembly can be attached to the reaction chamber wall 130 instead).

Figure 2:
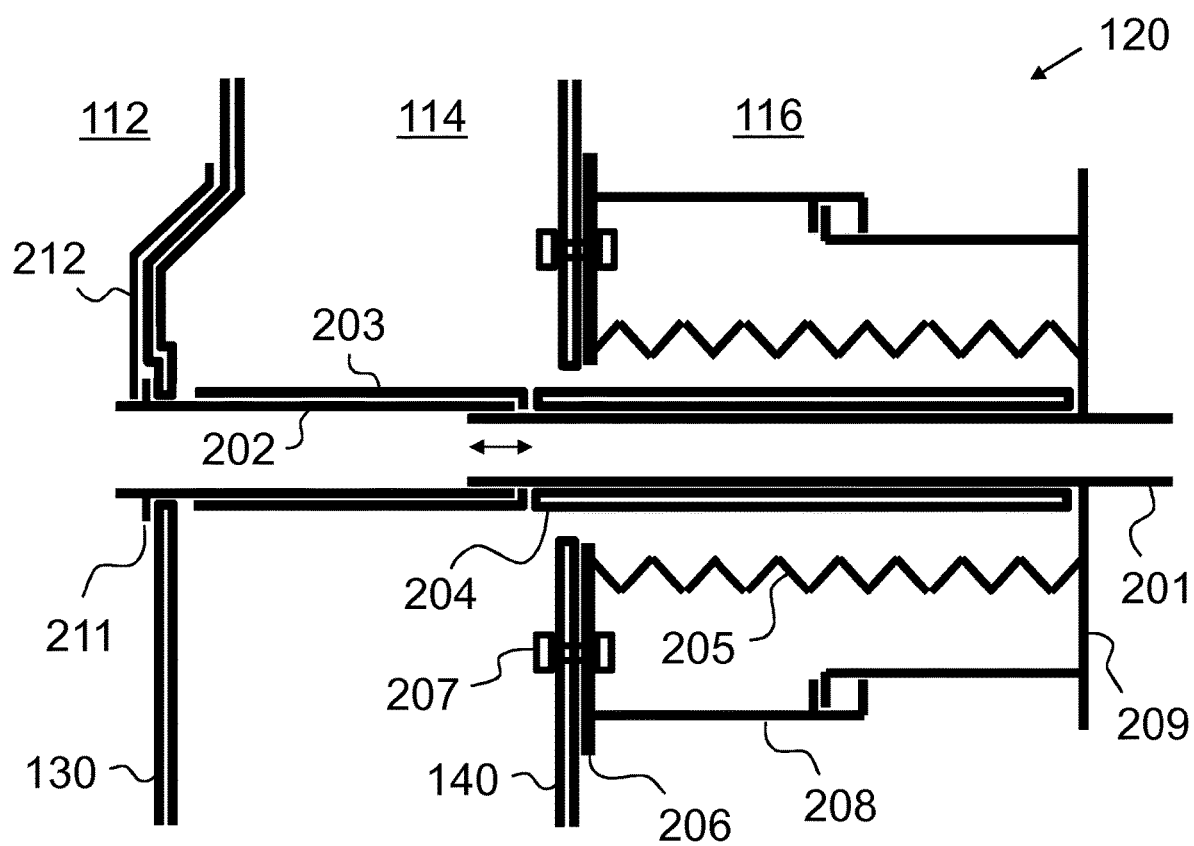
FIG. 2 shows a magnified sectional view of the fluid inlet assembly of FIG. 1.

FIG. 2 shows a magnified sectional view of the fluid inlet assembly 120. The fluid inlet assembly 120 is at one end attached to a fluid inlet pipe 201 and at the other end to an exterior surface of the chamber wall 140. In a practical embodiment, the fluid inlet assembly comprises a first end part 209 at a first end of the assembly and a second end part 206 at an opposite end of the assembly. The end parts 206, 209 may be flanges or similar. The fluid inlet pipe 201 penetrates through the chamber wall 140 within the assembly 120. The fluid inlet assembly 120 further comprises a resilient element 205 around the fluid inlet pipe 201 coupling the inlet pipe to the wall 140. The resilient element 205 may be gas tight or mostly gas tight. In a practical embodiment, the resilient element 205 is positioned in between the end parts 206, 209. The end part or flange 206 may be attached to the chamber wall 140 by fastening elements, such as bolts 207. The end part 209 may be attached to the fluid inlet pipe 201 by a VCR (Vacuum Coupling Radiation) connection, for example. A vacuum gap around the fluid inlet pipe 201 extends through the outer chamber wall 140 into a space within the assembly 120 that is delimited by an interior surface of the resilient element 205. The interior surface of the resilient element 205 therefore sees the pressure prevailing within the intermediate space 114, and an exterior surface of the resilient element 205 sees ambient pressure. In the depicted solution, the interior surface also sees the pressure of the reaction space 112 to some extent.

As mentioned in the preceding, the pressure within the intermediate space 114 during the operation of the substrate processing apparatus 100 is different from the ambient pressure. The pressure difference causes the resilient element 205 to contract (i.e., deform) causing the inlet pipe 201 to push oneself towards the reaction chamber.

When the volumes 112 and 114 are pressurized to ambient pressure, e.g., during maintenance periods, this causes the resilient element 205 to regain its original length with the effect of retracting the inlet pipe 201 outwards. This also decreases the stiffness of the resilient element 205 enabling its movement in any direction or angle so as to facilitate removing one or more parts from the apparatus when needed.

In certain example embodiments, such as shown in FIG. 2, the fluid inlet pipe 201 is formed of two pipes: the pipe 201 and a larger diameter pipe 202. The fluid inlet pipe 201 enters inside a larger diameter pipe 202, travels a (short) distance within the larger diameter pipe and is then discontinued. The pipes 201 and 202 thus overlap a certain distance. The larger diameter pipe extends from the discontinuity to the reaction chamber wall 130. The fitting between the pipes 201 and 202 is a tight fitting allowing the pipe 201 just to slide within the larger diameter pipe 202 in a horizontal direction when the inlet arrangement 120 contracts or lengthens due to pressure variations, as illustrated by the double arrow in FIG. 2. The larger diameter pipe 202 has a radial extension 211 locking the position of the pipe 202. The larger diameter pipe 202 can be pushed from the direction of the reaction chamber to a position in which the radial extension contacts the reaction chamber wall 130 and prevents further horizontal movement of the pipe 202. A collar 212 can be lowered at the other side of the radial extension preventing the pipe 202 from moving backwards, thereby locking the pipe 202 in its horizontal position. During maintenance, the pipe 202 can be pulled out via the reaction chamber.

In certain example embodiments, the inlet arrangement 120 comprises one or more mechanical limiters 208 which limit the horizontal movement of the inlet arrangement 120, and especially the horizontal movement of the resilient element 205. The mechanical limiters 208 may be implemented as independent bar elements that need not have rotational symmetry. The limiter(s) can be attached in between the end parts 206 and 209.

In certain example embodiments, the inlet arrangement 120 comprises a tubular heat conductor 204 around the pipe 201. In certain example embodiments, the inlet arrangement 120 comprises a further tubular heat conductor 203 around the pipe 202. The heat conductors 203 and 204 may receive heat from one or more heaters or they may be active heaters themselves. In certain example embodiments, there is a heat distributing element on top of a heater element around the inlet pipe 201 and/or 202. In certain example embodiments, the heat conductor(s) is/are to balance temperature differences and to create preferable heat gradients. Heating of the inlet pipe increases the incoming fluid temperature before it reaches the substrate 101. In certain example embodiments, a chemical source connected to pipe 201 is a heated source. In those embodiments, the whole way from the heated source to the substrate should be heated to avoid generation of cold spots.

The described fluid inlet assembly 120 provides for a pressure adjusted inlet clamping. The resilient element 205 may be implemented for example by a tube having a pleated form, such as a bellows, or by a spring in certain example embodiments. As mentioned, the inlet assembly 120 is configured to press against the reaction chamber or another pressure vessel due to a pressure difference between ambient pressure and the pressure prevailing within the interior of the pressure vessel. However, it should be noted that the described deformation (contracting or lengthening action) of the fluid inlet assembly 120 or resilient element 205 can be actuated in other example embodiments by other means, such as, by mechanical actuation. In those embodiments, e.g., motor(s) or memory shape alloys can be used to implement the actuation.

Depending on the implementation the fluid inlet assembly 120 creates a mechanically tight connection of the inlet pipe against a counterpart, which may be, for example, the reaction chamber wall 130, the collar 212, and/or the larger diameter pipe 202. In certain example embodiments, the resilient element 205 allows movement of the inlet pipe 201, 202 with respect to the reaction chamber wall 130. In certain example embodiments, the movement is caused by stress that is induced by pressure, temperature, or other structures of the apparatus, for example, a lid. The movement may, in practice, be in any direction and angle. In certain example embodiments, one or more further parts such as a pulsing valve is positioned to hang from the inlet pipe, not limiting movement of the resilient element 205. The resilient element 205 is without contact with the chemical(s) guided in the inlet pipe 201. Therefore, a potential material leak through the element 205 does not affect chemical reactions within the reaction space 112.

Figure 3:
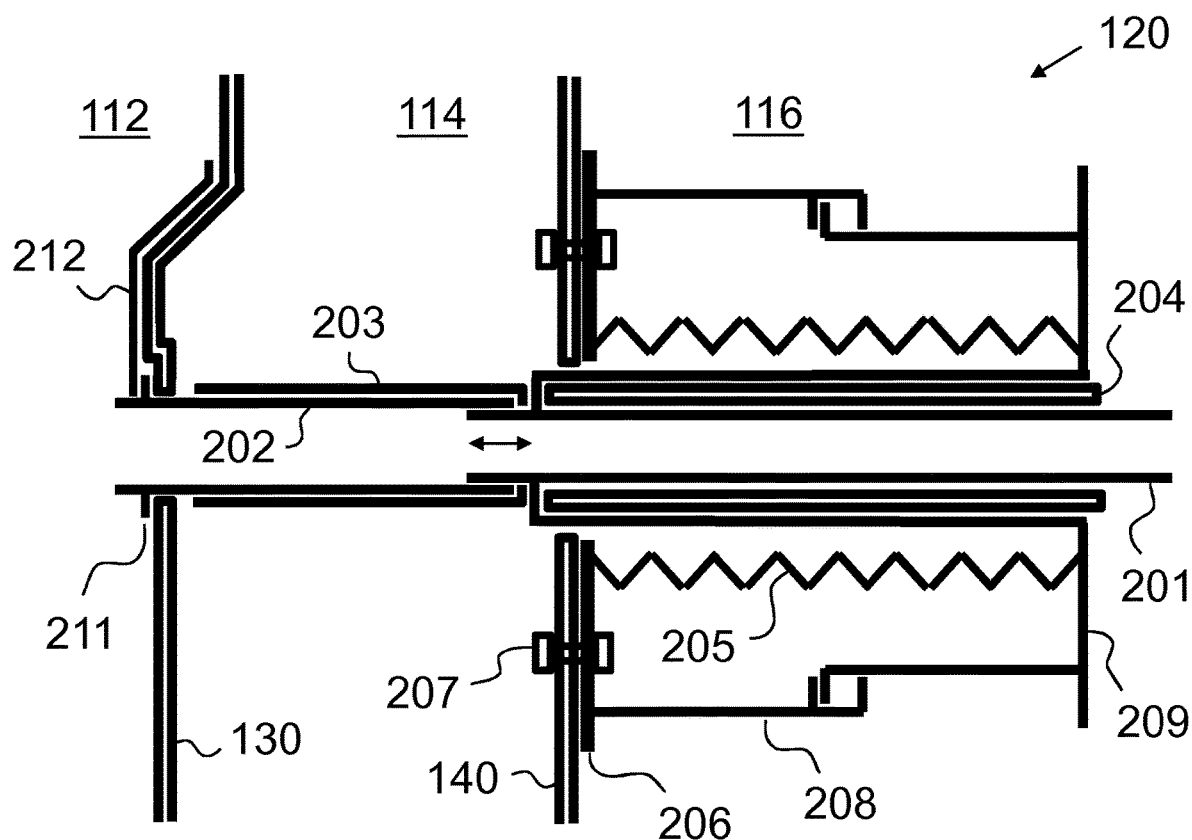
FIG. 3 shows a sectional view of the fluid inlet assembly in accordance with another example embodiment of the present disclosure.

FIG. 3 shows a sectional view of the fluid inlet assembly 120 in accordance with another example embodiment. The embodiment shown corresponds to the embodiments shown in FIGS. 1 and 2 except that the heat conductor 204 which was in the preceding embodiments positioned within the pressure region 114 has been positioned in ambient pressure region 116. At the same time the point of attachment in which the end part 209 joins the fluid inlet pipe 201 has been shifted towards the reaction chamber. The heat conductor 204 may alternatively be an active heater.

Figure 4:
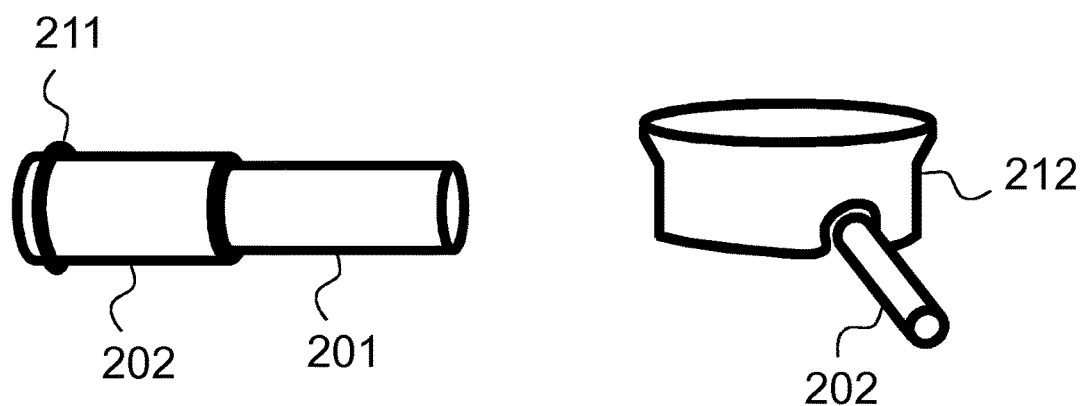
FIG. 4 illustrates certain parts disclosed in the preceding embodiments.

FIG. 4 illustrates the joining point of fluid inlet pipes 201 and 202. The pipe 201 is allowed to slide within the larger diameter pipe 202. FIG. 4 also shows the radial extension comprised by the pipe 202. FIG. 4 further illustrates the collar 212. The collar has an opening that is tight enough to allow the pipe 202 to fit through but to prevent the extension 211 from fitting through thereby providing for a locking effect of the pipe 202.

Figure 5A:
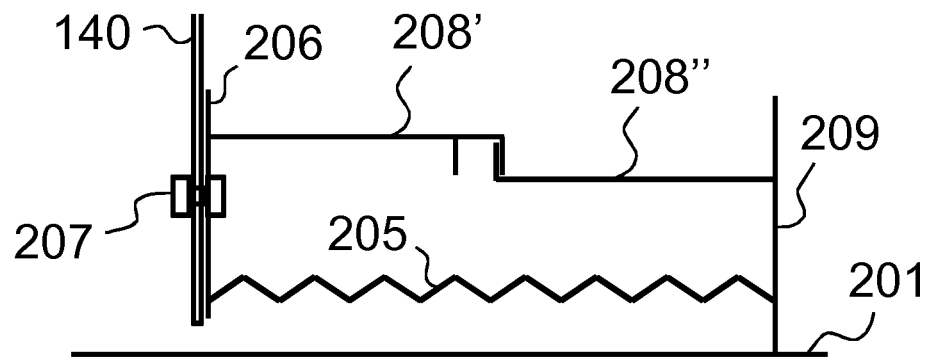
FIGS. 5a and 5b show the operation of mechanical limiters in accordance with certain example embodiments of the present disclosure.
Figure 5A:
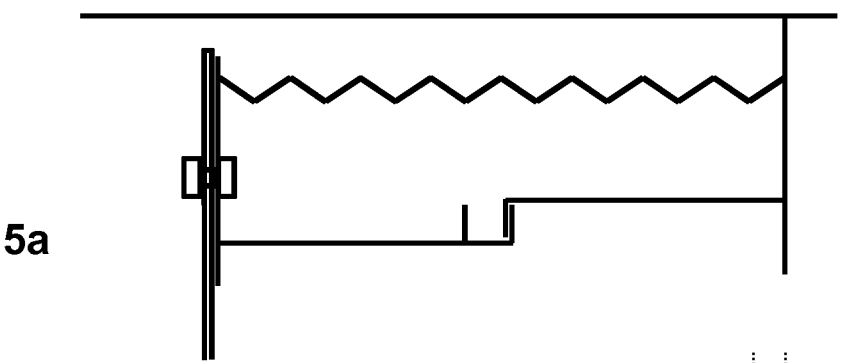
Figure 5B:
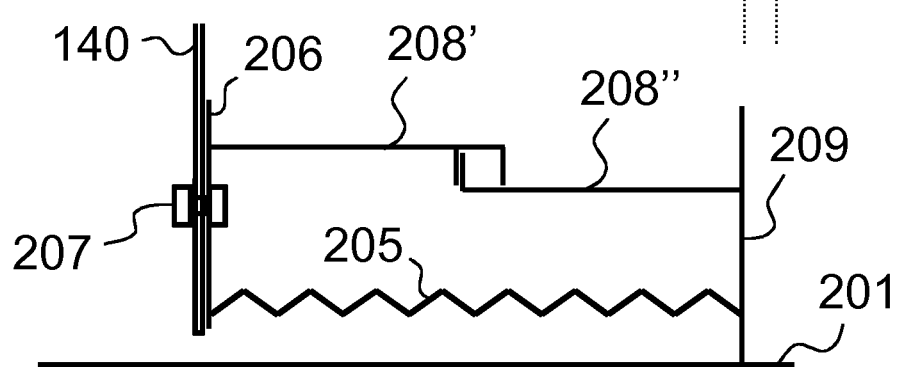
Figure 5B:
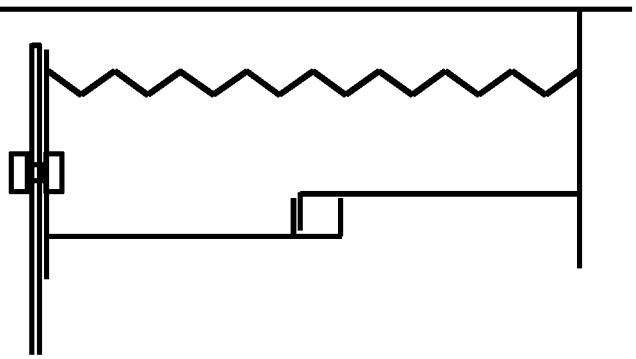

FIGS. 5a and 5b are sectional views showing the operation of the mechanical limiter(s) 208. FIG. 5a shows the situation in which the exterior surface of the resilient element 205 sees the same pressure as its interior surface, whereas FIG. 5b shows the situation in which the pressure is lower at the interior surface side.

An example of the mechanical limiter 208 shown in FIGS. 5a and 5b is formed of two connected bars 208' and 208". The bar 208' is attached to the end part 206, and the part 208" to the end part 209. The bar 208' comprises two end stoppers and the bar 208" a protruding part that is allowed to move in between the end stoppers thus setting endpoints for the longitudinal movement of the resilient element 205.

In the situation of FIG. 5a the resilient element 205 is in its normal length, and the protruding part is close to the end stopper that is closer to the end part 209. In the situation of FIG. 5b the resilient element 205 tends to contract in its longitudinal direction, and the protruding part together with the other end stopper (closer to the end part 206) sets the limit of maximum contraction. Although the limiters are drawn here to limit the motion in the horizontal direction, it is understood that limiting the extent of movement in any direction can be enabled depending on the implementation.

Figure 6:
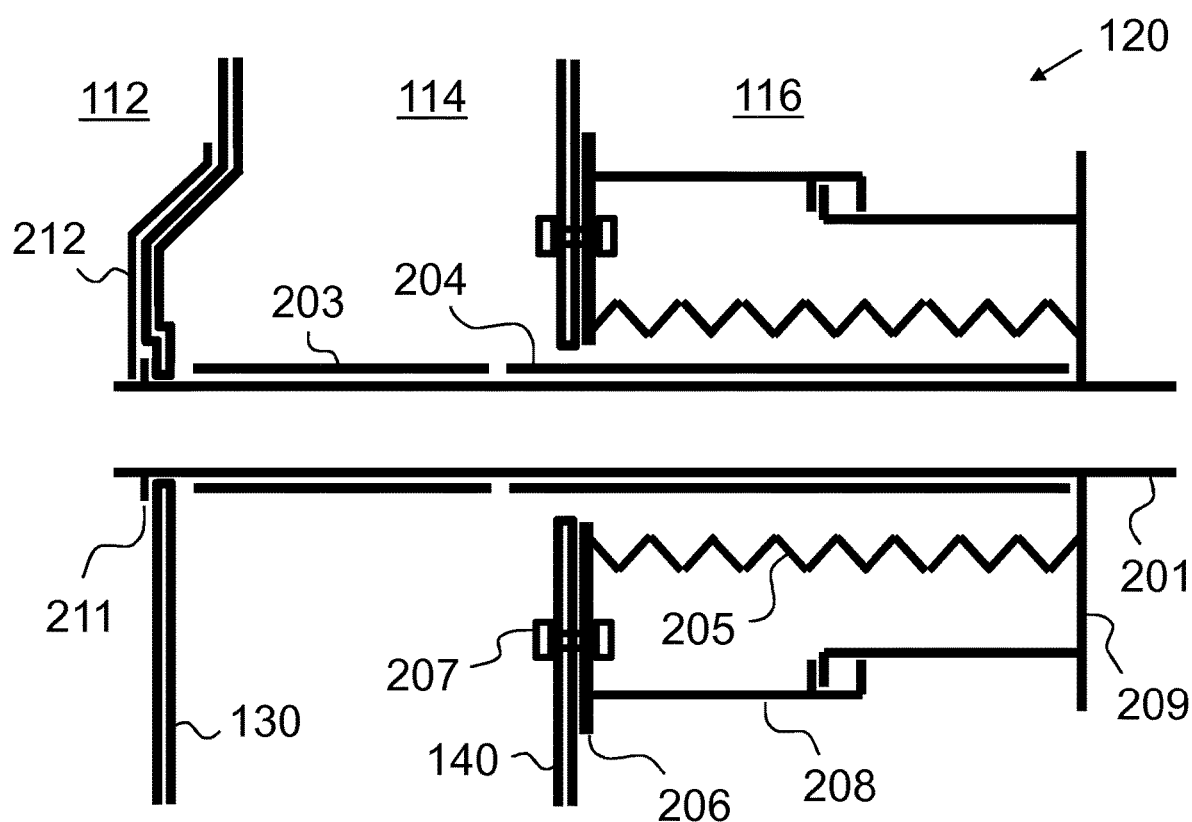
FIG. 6 shows a sectional view of the fluid inlet assembly in accordance with yet another example embodiment of the present disclosure.

FIG. 6 shows a sectional view of the fluid inlet assembly 120 in accordance with yet another example embodiment. The embodiment shown generally corresponds to the embodiments shown in FIGS. 1 and 2. However, in this embodiment, the fluid inlet pipe 201 extends all the way to the reaction chamber wall 130, and it is the pipe 201 that comprises the radial extension 211. The larger diameter pipe 202 is omitted.

Figure 7:
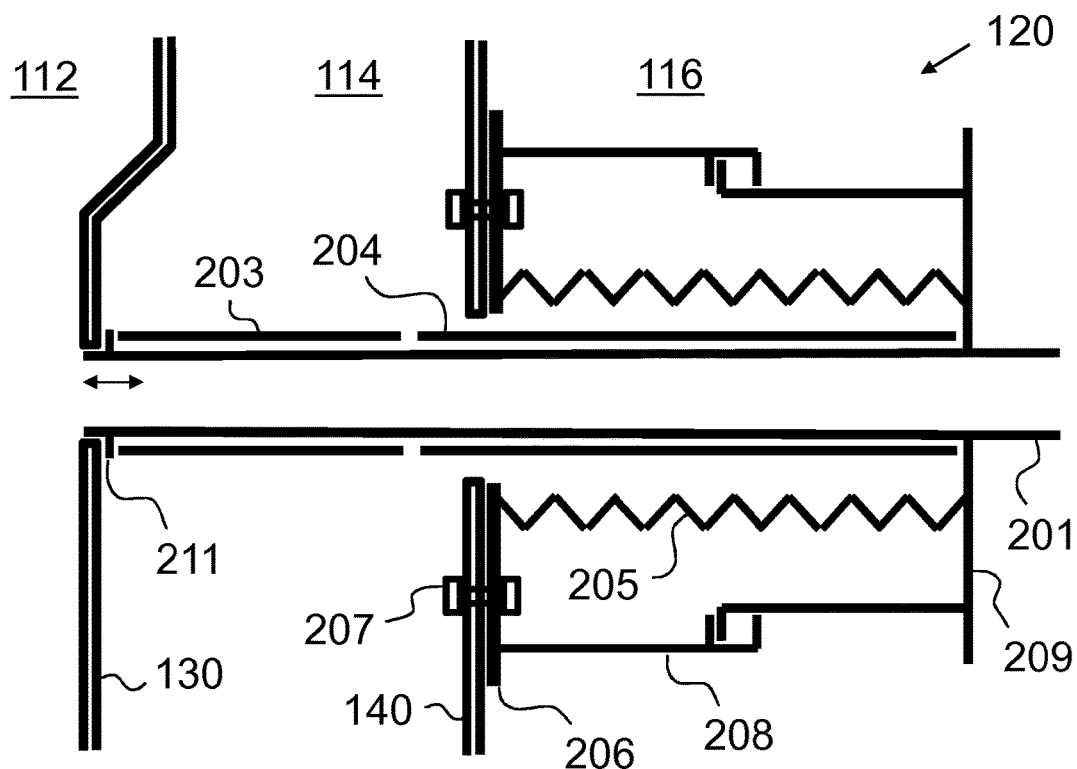
FIG. 7 shows a sectional view of the fluid inlet assembly in accordance with yet another example embodiment of the present disclosure.

FIG. 7 shows a sectional view of the fluid inlet assembly 120 in accordance with yet another example embodiment. The embodiment shown generally corresponds to the embodiment shown in FIG. 6. However, in this embodiment, the radial extension 211 is positioned on the inlet assembly side of the reaction chamber wall 130 whereas in the embodiment shown in FIG. 6 the radial extension 211 is positioned on the reaction chamber side of the reaction chamber wall 130. Contraction of the resilient element 205 presses the fluid inlet pipe 201 towards and/or against the reaction chamber wall 130. The radial extension 211 functions as a limiter for the longitudinal movement of the pipe 201. The heater(s) or heat conductor(s) 203 and 204 can be implemented as separate elements in line with each other or on top of each other. Or, the elements 203 and 204 can be implemented as one single element. Further, instead of being positioned within the vacuum side the heater 204 can be positioned in the ambient pressure region (for example, by positioning it into a groove extending along, or completely circularly surrounding, the surface of the inlet pipe 201 from the ambient side similarly as shown e.g. in FIG. 3). During maintenance, the inlet pipe 201 together with the assembly 120 can be pulled out from the outside (of the wall 140).

Figure 8:
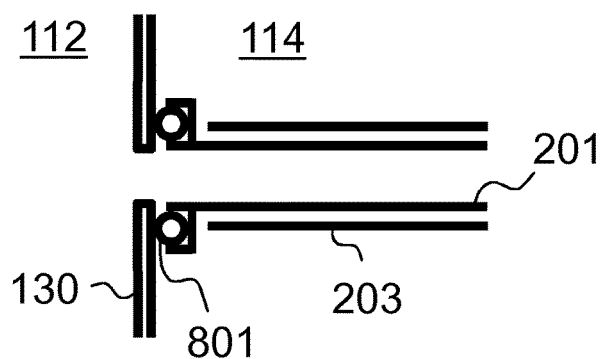
FIG. 8 shows a sectional view of the fluid inlet assembly in accordance with yet another example embodiment of the present disclosure.

FIG. 8 shows a sectional view of the fluid inlet assembly 120 in accordance with yet another example embodiment. The embodiment shown generally corresponds to the embodiment shown in FIG. 7. However, in FIG. 8, a sealing or reinforcement of the contact point at which the inlet pipe meets the reaction chamber or wall 130 has been described in greater detail. In accordance with FIG. 8 the fluid inlet assembly can contain a seal 801, such as an o-ring, in between the pipe 201 and the reaction chamber wall 130 to reduce chemical leakage into the intermediate space 114. The contact point can be implemented in various ways. Instead of or in addition to the step-like connection shown in FIG. 7 and the sealing implementation shown in FIG. 8, a cone-type connection, a ball-shaped or a semi-sphere shaped connection, any a surface connection with a suitable counter shape in the chamber wall 130 can be implemented. The contact point can be reinforced by a step-joint, a round joint, a ball joint, or by a separate cylinder, for example.

Figure 9:
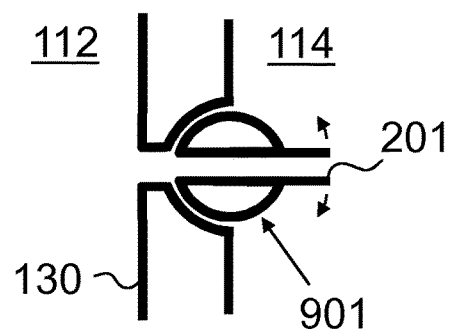
FIG. 9 shows a further sectional view of a contact point between an inlet pipe and a reaction chamber wall in accordance with certain example embodiments.

FIG. 9 shows one implementation in which the contact point (or joining point) 901 between the inlet pipe 201 and the reaction chamber wall 130 is arranged rotatably. The inlet pipe 201 comprises a curved or ball-shaped end, and the reaction chamber or chamber wall 130 comprises a concave counter surface. The inlet pipe 201 is allowed rotating movement at the formed joint or joining point when needed. In certain example embodiments, a feedthrough-opening through the wall 130 at the joining point may have a diameter larger than the inner diameter of the inlet pipe 201. In certain example embodiments, the joint is implemented in the interior side of the reaction chamber wall 130.

In yet alternative embodiments, the resilient element 205 is not a separate element but is an element manufactured to be an integral part of the chamber 140. Furthermore, the disclosed embodiments are not intended to limit the position of the resilient element 205, but rather to limit its mechanical function to allow the movement of one or more of the parts to which it is connected. In certain example embodiments, the pressure arrangement in which the pressure in the intermediate space 114 is higher than the pressure in the reaction chamber prevents reactive chemicals from coming into contact with the resilient element 205.

In certain alternative embodiments, the intermediate space 114 has pressure higher than the pressure in the ambient region 116. In such conditions, the mechanical pressure for the inlet assembly 120 can be created from the inside towards outside of the sealed pressure vessel or reaction chamber.

In certain example embodiments, the mechanical pressure put on the element 120 can be enforced, displaced or completely created by a mechanical actuator or by a spring load.

In yet certain alternative embodiments, the substrate processing apparatus comprises more than two walls, and the inlet assembly operates over each of the walls.

The description concerning any particular preceding embodiment is directly applicable to other disclosed embodiments. This applies both with regard to the structure and operation of the disclosed apparatus.

Without limiting the scope and interpretation of the patent claims, certain technical effects of one or more of the example embodiments disclosed herein are listed in the following. A technical effect is providing reduced unwanted stress in chemical inlet pipes and related structures. Another technical effect is an inlet pipe clamping that is adjustable by pressure or other means. Another technical effect is avoidance of cold spots and improved heat distribution at chamber feedthroughs. Another technical effect is improved serviceability.

It should be noted that some of the functions or method steps discussed in the preceding may be performed in a different order and/or concurrently with each other. Furthermore, one or more of the above-described functions or method steps may be optional or may be combined.

The foregoing description has provided by way of non-limiting examples of particular implementations and embodiments of the present disclosure a full and informative description of the best mode presently contemplated by the inventors for carrying out the present disclosure. It is however clear to a person skilled in the art that the present disclosure is not restricted to details of the embodiments presented above, but that it can be implemented in other embodiments using equivalent means without deviating from the characteristics of the present disclosure.

Furthermore, some of the features of the above-disclosed embodiments of this present disclosure may be used to advantage without the corresponding use of other features. As such, the foregoing description should be considered as merely illustrative of the principles of the present disclosure, and not in limitation thereof. Hence, the scope of the present disclosure is only restricted by the appended patent claims.

The invention claimed is:

1. A substrate processing apparatus, comprising:
a sealed pressure vessel forming an outer chamber that surrounds an inner chamber which is a sealed reaction chamber;
a fluid inlet assembly attached to a wall of the sealed pressure vessel, the fluid inlet assembly having a fluid inlet pipe passing through the wall, where the sealed reaction chamber comprises a collar locking the fluid inlet pipe in a horizontal position, the apparatus further comprising:
a resilient element in the fluid inlet assembly around the fluid inlet pipe coupling the fluid inlet pipe to the wall, where one of an interior surface and an exterior surface of the resilient element sees pressure prevailing within the pressure vessel and the other sees ambient pressure, and where the fluid inlet pipe prevents fluid carried inside from being in contact with the resilient element.

2. The apparatus of claim 1, where the resilient element is configured to deform under displacements between fixed first and second end parts of the fluid inlet assembly.

3. The apparatus of claim 1, where the resilient element is configured to cause mechanical pressure to the fluid inlet pipe.

4. The apparatus of claim 3, where the direction of mechanical pressure is inwards, towards the sealed reaction chamber.

5. The apparatus of claim 1, where the fluid inlet pipe is formed of two pipes arranged to slide inside each other.

6. The apparatus of claim 1, where the fluid inlet pipe is arranged to be disassembled by removing at least a portion of the fluid inlet pipe inwards via an interior of the apparatus.

7. The apparatus of claim 1, where the fluid inlet pipe is arranged to be disassembled by removing at least a portion of the fluid inlet pipe outwards to a direction pointing away from the apparatus.

8. The apparatus of claim 1, where the fluid inlet pipe is arranged to be in a fixed position with respect to a wall of the sealed reaction chamber.

9. The apparatus of claim 1, where the fluid inlet pipe is arranged to be in a rotatable position with respect to a wall of the sealed reaction chamber.

10. The apparatus of claim 1, where the fluid inlet pipe is equipped with a heat distributing element to distribute heat along the fluid inlet pipe.

11. The apparatus of claim 10, where the heat distributing element extends over a feedthrough point of the wall of the sealed pressure vessel.

12. The apparatus of claim 1, where a contact point at which the fluid inlet pipe meets the sealed reaction chamber is a non-permanent fixing point.

13. The apparatus of claim 12, where the contact point is sealed and/or enforced.

14. A method in a substrate processing apparatus, comprising:
providing a sealed pressure vessel forming an outer chamber that surrounds an inner chamber which is a sealed reaction chamber, the sealed pressure vessel having a fluid inlet assembly attached to a wall of the sealed pressure vessel, the fluid inlet assembly having a fluid inlet pipe passing through the wall, where the sealed reaction chamber comprises a collar locking the fluid inlet pipe in a horizontal position, and
providing a resilient element in the fluid inlet assembly around the fluid inlet pipe coupling the fluid inlet pipe to the wall, where one of an interior surface and an exterior surface of the resilient element sees pressure prevailing within the pressure vessel and the other sees ambient pressure, and where the fluid inlet pipe prevents fluid carried inside from being in contact with the resilient element, the method further comprising:
causing mechanical pressure to the fluid inlet pipe via contraction of the resilient element, the direction of the mechanical pressure being towards the pressure vessel interior.

15. The method of claim 14, where the mechanical pressure is caused by a pressure difference between the pressure prevailing within the pressure vessel and the ambient pressure.

* * * * *